(12) United States Patent
Chang et al.

(10) Patent No.: US 11,815,802 B2
(45) Date of Patent: Nov. 14, 2023

(54) PHOTOMASK REPAIRING METHOD AND SYSTEM THEREOF

(71) Applicant: TAIWAN SEMICONDUCTOR MANUFACTURING COMPANY LTD., Hsinchu (TW)

(72) Inventors: Hao-Ming Chang, Pingtung (TW); Ching-Chih Chuang, Hsinchu (TW); Hsiao-Chen Li, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 224 days.

(21) Appl. No.: 17/460,055

(22) Filed: Aug. 27, 2021

(65) Prior Publication Data
US 2023/0069679 A1    Mar. 2, 2023

(51) Int. Cl.
*G03F 1/24* (2012.01)
*G03F 1/72* (2012.01)
*G03F 1/74* (2012.01)

(52) U.S. Cl.
CPC ............... *G03F 1/24* (2013.01); *G03F 1/72* (2013.01); *G03F 1/74* (2013.01)

(58) Field of Classification Search
CPC ................. G03F 1/24; G03F 1/72; G03F 1/74
USPC ............................................................ 430/5
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

*Primary Examiner* — Christopher G Young
(74) *Attorney, Agent, or Firm* — WPAT LAW; Anthony King

(57) ABSTRACT

A method includes: providing a photomask, wherein the photomask includes a multilayer stack, a light-absorption layer, an anti-reflection coating and a light-absorption layer. The method further includes: receiving information on the photomask; determining a bias voltage according to the information; determining a scan recipe of an electron beam writer system based on the bias voltage; and performing a repairing operation on at least one of the anti-reflection coating and the light-absorption layer by the electron beam writer system with the scan recipe.

20 Claims, 12 Drawing Sheets

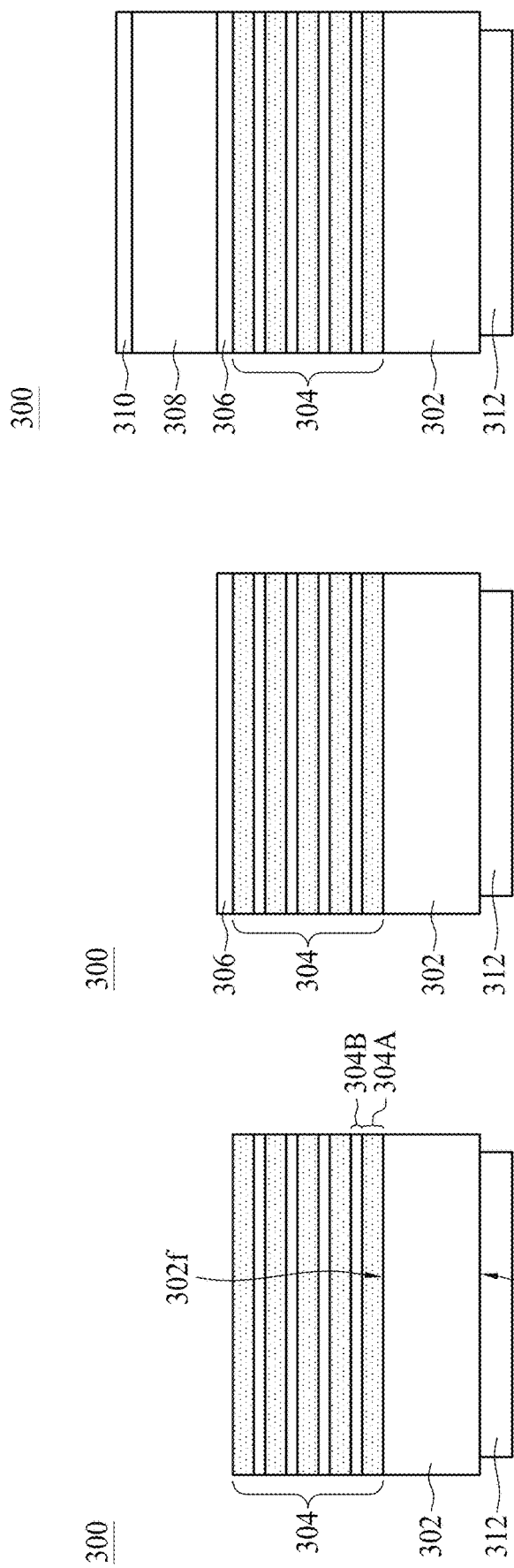

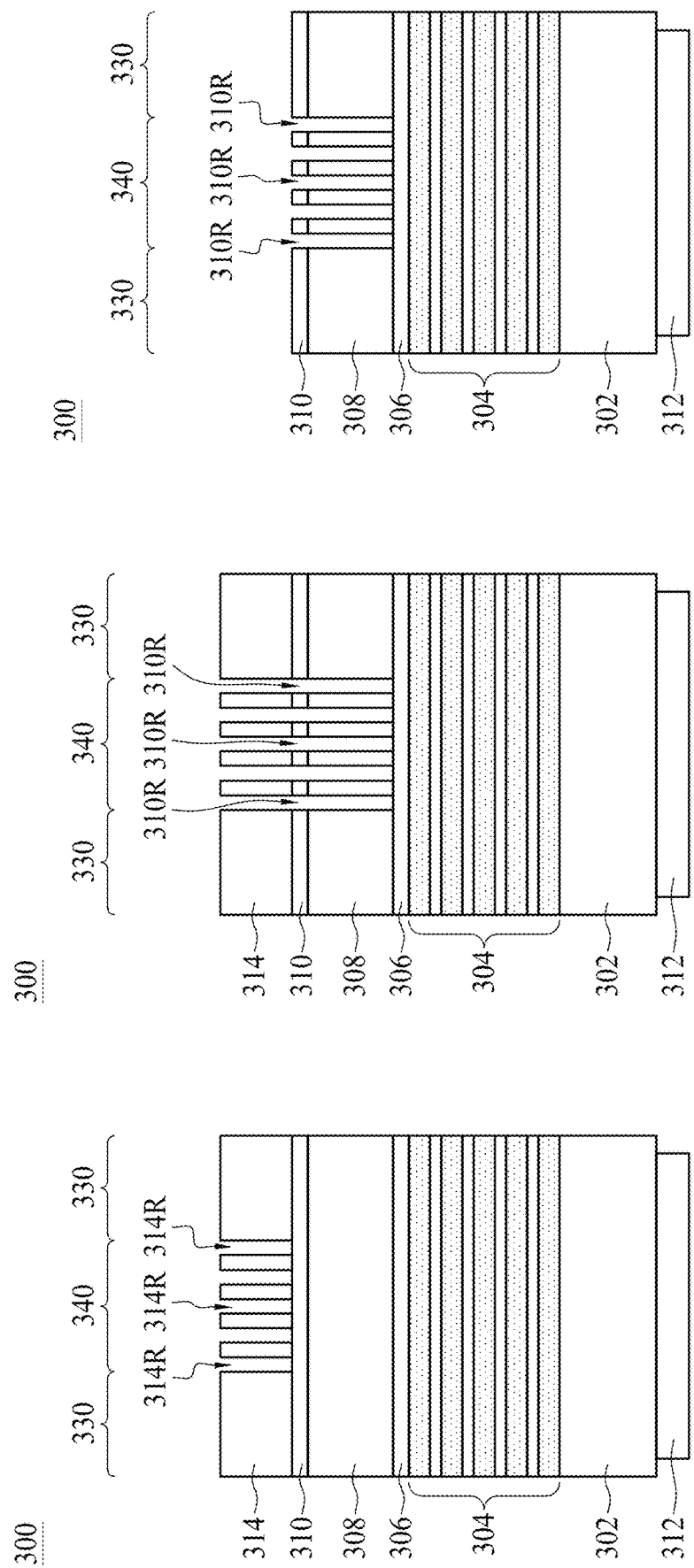

PHOTOMASK REPAIRING METHOD AND SYSTEM THEREOF

BACKGROUND

In advanced semiconductor technologies, the continuing reduction in device size and increasingly complex circuit arrangements have made the design and fabrication of integrated circuits (ICs) more challenging and costly. To pursue better device performance with smaller footprint and less power, advanced lithography technologies, e.g., extreme ultraviolet (EUV) lithography, have been investigated as approaches to manufacturing semiconductor devices with a relatively small line width, e.g., 30 nm or less. EUV lithography employs a photomask to control the irradiation of a substrate under EUV radiation so as to form a pattern on the substrate.

While existing lithography techniques have improved, they still fail to meet requirements in many aspects. For example, the fabrication and maintenance of the EUV photomask is time-consuming and costly.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A to 3J are cross-sectional views of intermediate stages of the method shown in FIG. 2, in accordance with some embodiments of the present disclosure.

DETAILED DESCRIPTION

Figure 1:
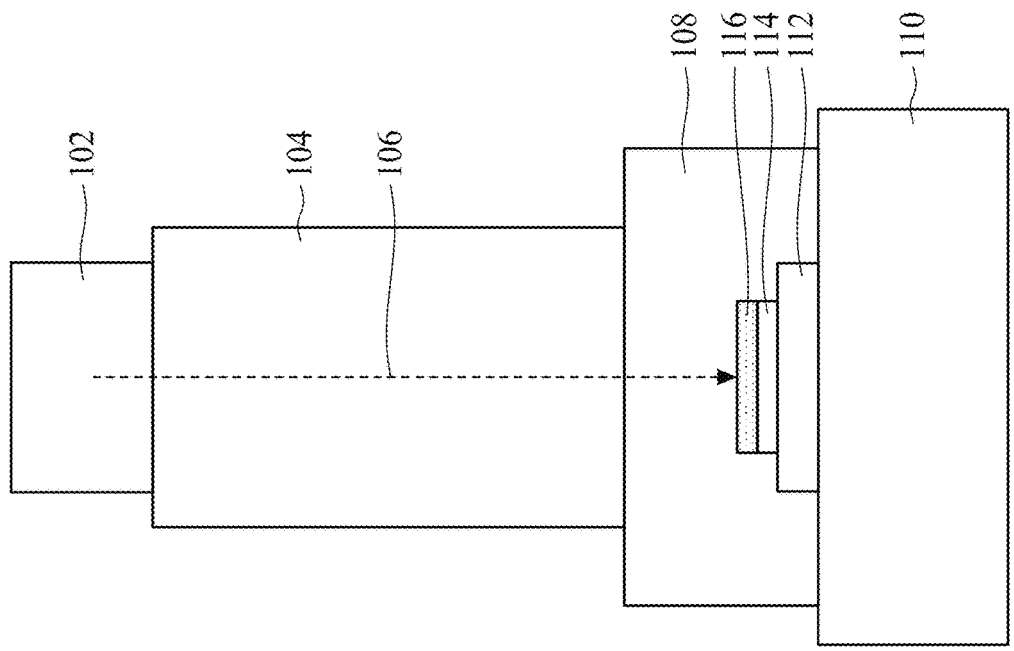
FIG. 1 is a schematic diagram of an electron beam writer system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "photomask," "reticle" and "mask" used throughout the present disclosure refer to a device used in a lithography system, in which a patterned image according to a circuit pattern is formed on a substrate plate. The substrate plate may be transparent. The image of the circuit pattern on the photomask is transferred to a workpiece through a radiation source of the lithography system. Lithography radiation emitted from the radiation source is incident on the workpiece via the photomask in a transmissive or reflective manner.

An extreme ultraviolet (EUV) photomask is typically a reflective mask that includes circuit patterns formed thereon and is used to transfer the circuit pattern onto the workpiece, such as a wafer, through reflection of a patterned EUV radiation from a light-reflective layer during a photolithography operation. The EUV photomask generally includes an anti-reflection coating (ARC) and a light-absorption layer (LAL) above the light-reflective layer, in which the ARC and the LAL are patterned to form the circuit pattern. The EUV photomask also includes a capping layer between the patterned LAL and the light-reflective layer. The patterned EUV light is reflected from the light-reflective layer, through the capping layer, the patterned LAL and the ARC, and radiated onto the wafer.

After a new EUV photomask is formed or when a fabricated EUV photomask has been operated for predetermined period, a routine checking is performed to ensure the integrity and performance of the EUV photomask. If a defect or undesirable material is found in the EUV photomask, for example, an unwanted portion of the circuit pattern or a foreign particle is formed in the ARC or the LAL, an etching operation is performed to remove the defect. Since the capping layer plays an important role in protecting the underlying light-reflective layer, the etching operation on the ARC and LAL should be performed with care such that the capping layer would not be damaged. As a result, the etching operation on the ARC and LAL is generally made gentle and slow, and thus is time-consuming and costly.

The present disclosure provides a method of repairing the EUV photomask. In the proposed scheme, the recipe of operating the etching apparatus, e.g., an electron beam writer, is revisited, in which the bias voltage is tuned to increase the etching rate of at least one of the ARC and LAL while reducing the adverse impact on the capping layer. Although the etching rate of the ARC or the LAL are increased due to the increased beam energy, the etch durability of the capping layer is enhanced as well. Therefore, the etching time can be reduced greatly without increasing the risk of damaging the capping layer. The efficiency of photomask repairing/fabrication is significantly enhanced accordingly.

FIG. 1 is a schematic diagram of an electron beam writer system 100, in accordance with some embodiments of the present disclosure. The electron beam writer system 100 includes an electron source 102, an electron optical column 104, a chamber 108, a pump unit 110, and a wafer stage 112. The configuration of the electron beam writer system 100 shown in FIG. 1 is exemplary. Other configurations and inclusion or omission of devices may be possible. In the present disclosure, the electron beam writer system 100 is also referred to as an electron beam lithography system or an e-beam writer. During a writing operation, a workpiece, e.g., a substrate 114, is provided to the electron beam writer system 100 for receiving a writing operation, e.g., an inspection or an etching operation.

In some embodiments, the electron source 102 includes an electron gun configured to provide a plurality of electrons emitted therefrom. In some embodiments, the electron gun includes a conducting material, referred to as a thermionic source, heated to a high temperature to provide sufficient energy to the electrons such that the electrons can overcome the work function barrier of the conducting material and escape from the conducting material. In some other embodiments, the conducting material of the electron gun is referred to as a field emission source and is supplied by an electric field that the electrons can tunnel through the work function barrier.

In some embodiments, the electron source 102 further includes an acceleration module (not separately shown) configured to boost the electron beam energy. The acceleration module may include one or more anode plates around the outlet of the electron gun. The anode plates are supplied with a positive acceleration voltage to generate an electric field that can accelerate the electrons. In some embodiments, the intensity of the electric field determines the electron beam energy and is largely determined by the bias voltage of the anode plates. In some embodiments, the acceleration (bias) voltage is in a range between 0 kV and about 10 kV, dependent upon the applications.

In some embodiments, the electron optical column 104 is configured to shape the emitted electrons into an electron beam 106. In some embodiments, the electron optical column 104 includes a plurality of electromagnetic apertures, electrostatic lenses, electromagnetic lenses, shaping deflectors, cell selection deflectors, and the like. According to various configurations of the electron optical column 104, the electron beam 106 may be generated to provide the beam spot, e.g., in the form of a Gaussian electron beam, a cell projection electron beam, or other electron beam shapes.

The chamber 108 is configured to accommodate the workpiece during the electron beam writing operation. In some embodiments, the chamber 108 includes a wafer loading and unloading unit (not separately shown) for transporting the workpiece without interrupting an operation of the electron beam writer system 100. In some embodiments, the chamber 108 has a wafer stage 112 for supporting and holding the workpiece. The wafer stage 112 may include one or more positioning devices, such as motors and roller guides, to provide accurate alignment and movement of the workpiece in X, Y and Z directions for achieving better performance in focusing, leveling, exposure or other actions.

In some embodiments, the pump unit 110 is configured to provide a substantially vacuum or high vacuum environment of the electron beam writer system 100. In some embodiments, the pump unit 110 includes one or more pumps and filters.

In some embodiments, the workpiece is provided with the substrate 114 having a material layer 116 formed thereon. The substrate 114 may be a wafer substrate or a mask blank. The wafer substrate may include a silicon wafer. Alternatively or additionally, the substrate 114 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP.

The material layer 116 may be a photoresist or other suitable layers. In some other embodiments, the material layer 116 includes a semiconductor layer, a conductive layer or a dielectric layer. In some embodiments, the material layer 116 has multilayer structure.

Figure 2:
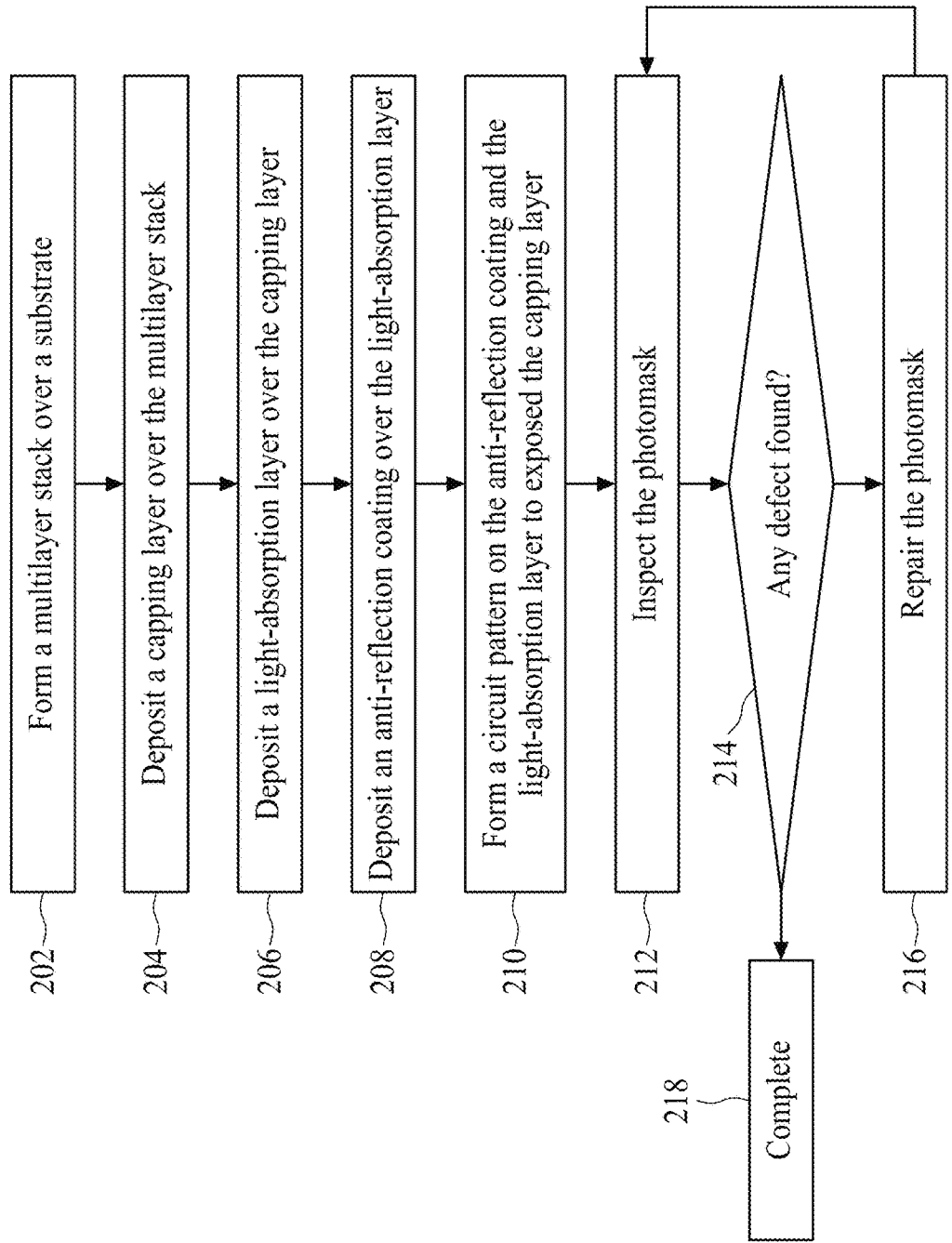
FIG. 2 is a flowchart of a method of fabricating and repairing a photomask, in accordance with some embodiments.

FIG. 2 is a flowchart of a method 200 of fabricating and repairing a photomask, in accordance with some embodiments. It should be understood that additional operations can be provided before, during, and after the various steps shown in FIG. 2, and some of the operations described below can be replaced or eliminated, for additional embodiments of the method 200.

FIGS. 3A to 3J are cross-sectional views of a photomask 300 at intermediate stages of the method 200 shown in FIG. 2, in accordance with some embodiments of the present disclosure. In some embodiments, the photomask 300 is a reflective photomask, such as a EUV mask, or a transmission type photomask. The photomask 300 may be used under a radiation source having a wavelength between about 1 nm and 100 nm, e.g., 13.5 nm (EUV wavelength). However, the photomask 300 can also be suitable for deep UV (DUV) or other suitable wavelengths. In an embodiment in which the photomask 300 is constructed as a reflective mask, a patterning radiation for a wafer is formed via reflection of incident radiation from the photomask 300.

Referring to step 202 of FIG. 2 and FIG. 3A, a multilayer stack 304 is formed over a substrate 302. Initially, the substrate 302 is provided or formed. The substrate 302 is formed of a low thermal expansion material (LTEM), such as fused silica, fused quartz, silicon, silicon carbide, black diamond or other low thermal expansion substances. In some embodiments, the substrate 302 serves to reduce image distortion resulting from mask heating. In the present embodiment, the substrate 302 includes material properties of a low defect level and a smooth surface. In some embodiments, the substrate 302 transmits light at a predetermined spectrum, such as visible wavelengths, infrared wavelengths near the visible spectrum (near-infrared), and ultraviolet wavelengths. In some embodiments, the substrate 302 absorbs EUV wavelengths and DUV wavelengths.

The multilayer stack 304 is formed over a front side 302f of the substrate 302. The multilayer stack 304 serves as a radiation-reflective layer of the photomask 300. The multilayer stack 304 may include pairs of light-reflective layers, wherein each pair is, e.g., formed of a molybdenum (Mo) layer 304A and a silicon (Si) layer 304B. The number of alternating Mo layers and Si layers (i.e., the number of Mo/Si pairs) and the thicknesses of the Mo layers 304A and the Si layers 304B are determined so as to facilitate constructive interference of individual reflected rays (referred to as Bragg reflection) to thereby increase the reflectivity of the multilayer stack 304. In some embodiments, the reflectivity of the multilayer stack 304 is greater than about 60% for wavelengths of interest e.g., about 13.5 nm. In some embodiments, the number of Mo/Si pairs in the multilayer stack 304 is between about 20 and about 80, e.g., 40. Further, in some embodiments, each of the Mo layers 304A or each of the Si layers 304B has a thickness between about 2 nm and about 10 nm, e.g., 7 nm. The Si layers 304B and Mo layers 304A may be formed by physical vapor deposition (PVD), chemical vapor deposition (CVD), plasma-enhanced CVD (PECVD), atomic layer deposition (ALD), or any other suitable process.

In some embodiments, the photomask 300 further includes a conductive layer 312 on a backside 302b of the substrate 302. The conductive layer 312 may aid in engaging the photomask 300 with an electric chucking mechanism (not separately shown) in a lithography system. In some embodiments, the conductive layer 312 includes chromium nitride (CrN), chromium oxynitride (CrON), or another suitable conductive material. In some embodiments, the conductive layer 312 includes a thickness in a range from about 50 nm to about 400 nm. The conductive layer 312 may have a surface area less than the surface area of the substrate 302. The conductive layer 312 may be formed by CVD, PVD, ALD, molecular beam epitaxy (MBE), pulsed laser deposition, electron-beam evaporation, ion beam assisted evaporation, or any other suitable film-forming method.

Referring to step 204 of FIG. 2 and FIG. 3B, a capping layer 306 is deposited over the multilayer stack 304. In some embodiments, the capping layer 306 is used to prevent oxidation of the multilayer stack 304 during a patterning process. In some embodiments, the capping layer 306 is made of ruthenium (Ru) or ruthenium oxide ($RuO_2$). Other capping layer materials, such as silicon dioxide ($SiO_2$), amorphous carbon or other suitable compositions, can also be used in the capping layer 306. The capping layer 306 may have a thickness between about 1 nm and about 10 nm. In certain embodiments, the thickness of the capping layer 306 is between about 2 nm and about 4 nm, e.g., about 3.5 nm. In some embodiments, the capping layer 306 is formed by PVD, CVD, low-temperature CVD (LTCVD), ALD or any other suitable film-forming method.

Referring to step 206 of FIG. 2 and FIG. 3C, a light-absorption layer (LAL) 308 is disposed over the capping layer 306. In some embodiments, the LAL 308 is an anti-reflective layer that absorbs radiation in the EUV wavelengths incident to the photomask 300. The LAL 308 may include chromium, chromium oxide, titanium nitride, tantalum nitride, tantalum oxide, tantalum boron nitride, tantalum, titanium, aluminum-copper, combinations thereof, or the like. The LAL 308 may be formed of a single layer or of multiple layers. For example, the LAL 308 includes a chromium layer and a tantalum nitride layer. In some embodiments, the LAL 308 has a thickness in a range between about 10 nm and about 100 nm, or between 40 nm and about 80 nm, e.g., about 70 nm. In some embodiments, the LAL 308 is formed by PVD, CVD, LTCVD, ALD or any other suitable film-forming method.

Referring to step 208 of FIG. 2 and FIG. 3C, an anti-reflective coating (ARC) 310 is disposed over the LAL 308. The ARC 310 may reduce reflection of the impinging radiation having a wavelength shorter than the DUV from the LAL 308. The ARC 310 may be a TaBO layer. Other materials, such as $Cr_2O_3$, ITO, SiN and $TaO_5$, may also be used. The ARC 310 has a thickness between about 1 nm and about 5 nm, such as 2 nm. In other embodiments, a silicon oxide film having a thickness between about 1 nm and about 10 nm is adopted as the ARC 310. In some embodiments, the ARC 310 is formed by PVD, CVD, LTCVD, ALD, or any other suitable film-forming method.

In some embodiments, each of the aforementioned layers 304, 306, 308 and 310 can be formed in a blanket manner over one another.

Referring to step 210 of FIG. 2 and FIG. 3D, a mask layer 314 is deposited over the ARC 310. The mask layer 314 may be a photoresist layer formed of a photosensitive material or other suitable resist materials, or a dielectric material, such as oxide, nitride or the like. The mask layer 314 may be deposited over the ARC 310 by CVD, ALD, PVD, spin coating, or other suitable film-forming method. Once formed, the mask layer 314 is patterned according to a predetermined circuit pattern. Patterning of the mask layer 314 may include a mask-less exposure such as electron-beam writing, ion-beam writing, laser-beam writing, or the like. The mask layer 314 is then developed and etched to remove unwanted portions of the mask layer 314. Openings 314R are formed through the patterning operations.

Referring to step 210 of FIG. 2 and FIG. 3E, the circuit pattern is transferred from the mask layer 314 to the ARC 310 and the LAL 308. The patterning operations of the ARC 310 may be performed by an etching operation, such as an electron beam etching, a laser etching, a dry etching, a wet etching, a reactive ion etching, or the like. In the present embodiments, the patterning operation includes a reactive plasma etching. Openings 310R are formed through the ARC 310 following the pattern of the openings 314R. In some embodiments, when viewed from above, the photomask 300 includes an imaging region 340 and a border region 330 laterally surrounding the imaging region 340, in which the circuit pattern is formed within the imaging region 340. Therefore, the openings 310R are formed in the imaging region 340. Portions of the surface of the LAL 308 are thus exposed through the patterning operation of the ARC 310.

Subsequently, the LAL 308 is also patterned according to the circuit pattern on the ARC 310. The patterning operations of the LAL 308 may be performed by an etching operation, such as an electron beam etching, a laser etching, a dry etching, a wet etching, a reactive ion etching, or the like. In the present embodiments, the patterning operation includes an electron beam etching, and the ARC 310 and LAL 308 may be patterned using a single patterning operation. The circuit pattern on the LAL 308 may follow that on the ARC 310. The openings 310R are formed from the ARC 310, through the LAL 308 and expose the capping layer 306.

Referring to FIG. 3F, the mask layer 314 is removed or stripped after the patterning of the ARC 310 and LAL 308 is completed. The removal of the mask layer 314 is performed using a dry etch, a wet etch or an ashing operation. In some embodiments, the mask layer 314 is removed right after the patterning of the ARC 310 prior to the patterning of the LAL 308, in which the ARC 310 serves as an etching mask of the LAL 308 during the patterning of the LAL 308.

Figure 3H:
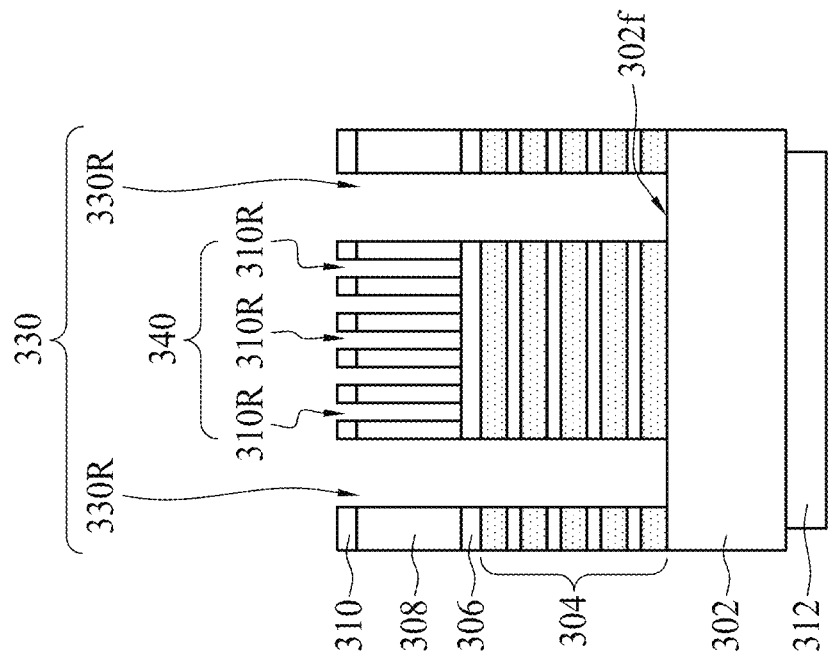
Figure 3G:
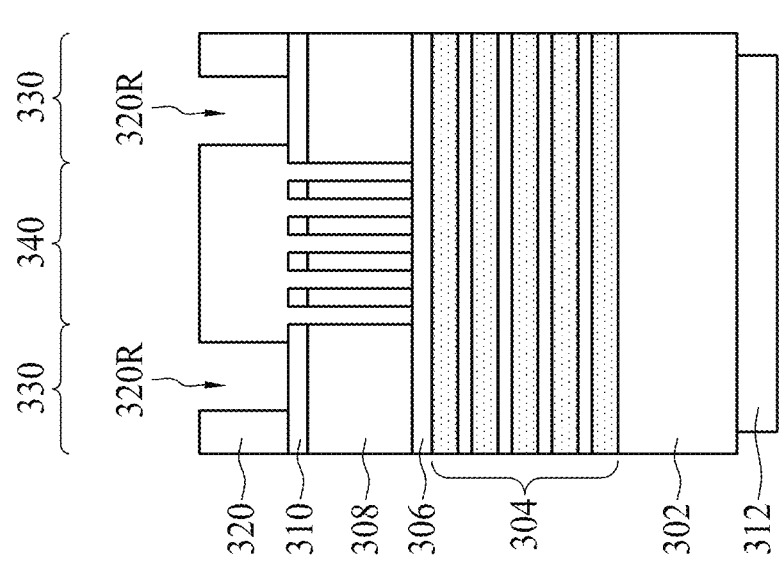

FIGS. 3G and 3H illustrate the patterning of the border region 330. Initially, a photoresist layer 320 is deposited over the ARC 310, as shown in FIG. 3G. The photoresist layer 320 may be formed of a photosensitive material. The photoresist layer 320 may be deposited over the ARC 310 by CVD, ALD, PVD, spin coating, or other suitable film-forming method. The photoresist layer 320 may fill the openings 310R. Once formed, the photoresist layer 320 is patterned to define the border regions 330. Patterning of the photoresist layer 320 may include a mask-based or mask-less exposure, developing the photoresist layer 320 and etching unwanted portions of the photoresist layer 320. Openings 320R are formed in the photoresist layer 320 through the patterning operations shown in FIG. 3G.

Figure 3J:
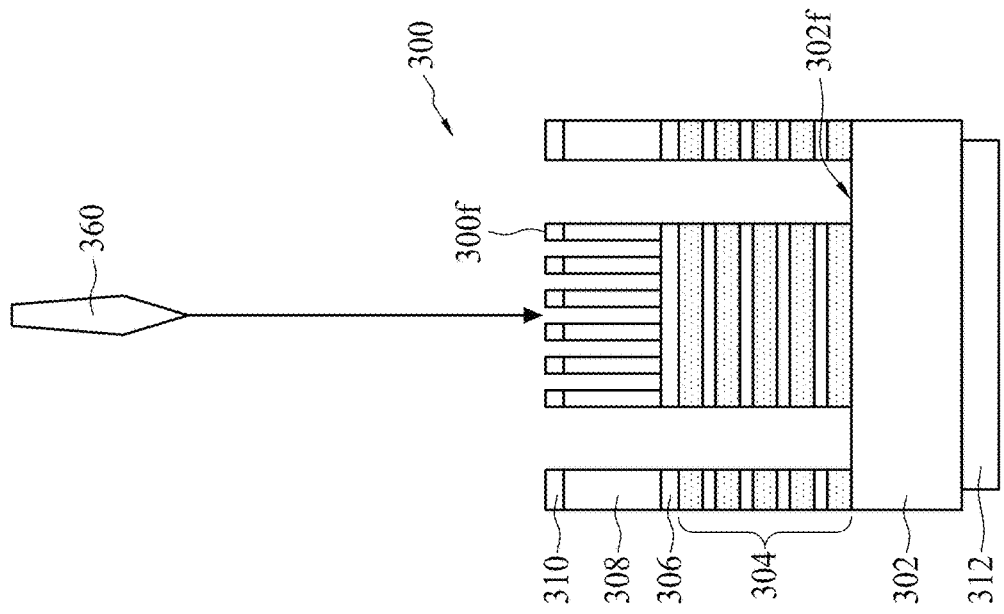

Subsequently, an etching operation is performed to form trenches 330R of the border region 330 according to the openings 320R of the photoresist layer 320. The trenches 330R may have a ring shape from a top-view perspective, as illustrated in FIG. 3K. The etching operation may include a dry etch, a wet etch, a reactive ion etch, or the like. Through the etching operations, the trenches 330R extend through the ARC 310, the LAL 308, the capping layer 306, and the multilayer stack 304, and expose the front side 302f of the substrate 302. The imaging region 340 is thus defined and surrounded by the border region 330 from a top-view perspective, as illustrated in FIG. 3K.

Referring to FIG. 3H, after the trenches 330R are formed, the photoresist layer 320 is removed, and the trenches 330R are left in place. The circuit pattern represented by the openings 310R is exposed. The removal operation may include an etching or ashing operation. In some embodiments, the border region 330 serves to prevent excess radiation around the boundary of the imaging region 340 from leaking into adjacent imaging regions of a same wafer. To this end, the reflectivity of the border region 330 is made as low as possible, e.g., lower than about 0.1%.

Figure 3I:
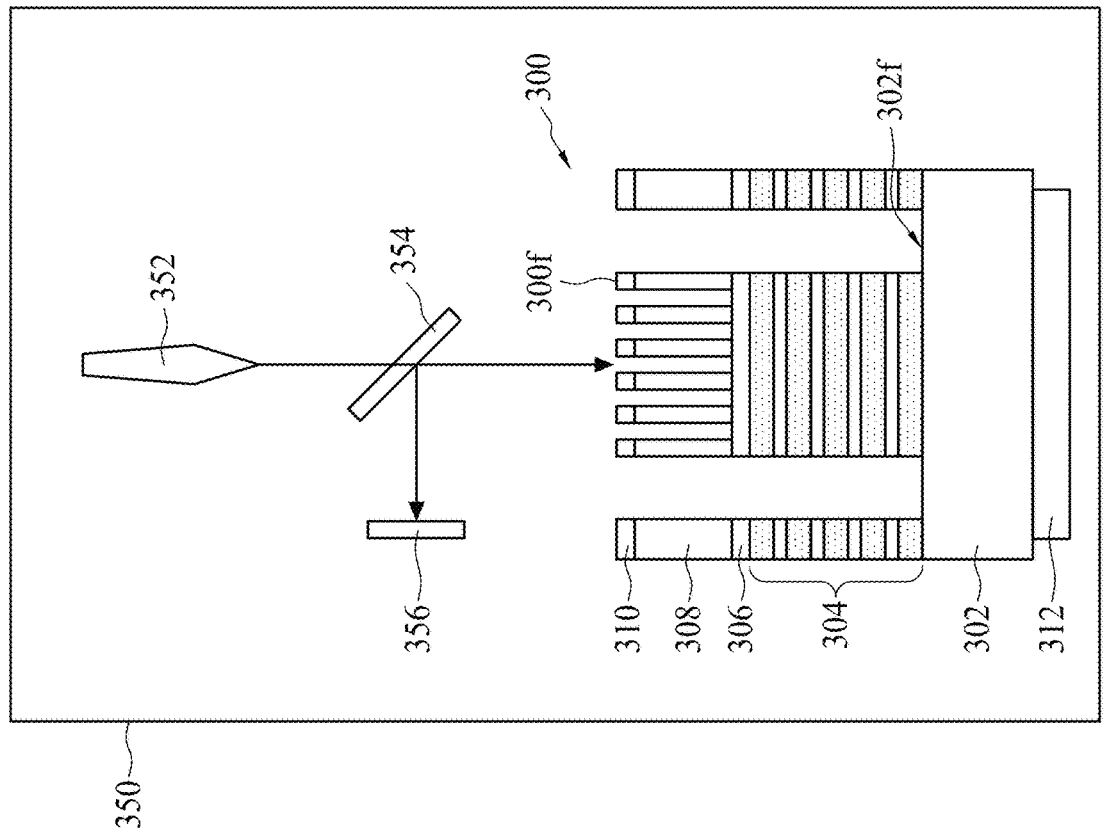

Referring to step 212 of FIG. 2 and FIG. 3I, the photomask 300 is inspected using an inspection tool 350. The inspection tool 350 is configured to generate an image of a surface 300f of the photomask 300. The inspection tool 350 may include a radiation source 352, an optical element 354 and a sensor 356.

In some embodiments, the radiation source 352 is configured to emit an inspection radiation beam, such as an electron beam, an x-ray or a visible light to illuminate the surface of the photomask 300. The inspection radiation beam incident on the surface 300f of the photomask 300 has different reflection intensities in different portions according to the circuit pattern formed on the ARC 310 and LAL 308. The reflected radiation beam is received by the sensor 356 through the optical element 354. In some embodiments, the optical element 354 is a beam splitter. In some embodiments, the inspection image is generated according to the reflected radiation beam received by the sensor 356.

Referring to step 214 of FIG. 2 and FIG. 3I, it is determined whether any defects are found. The defect may be a foreign particle, a portion of the photomask that should be removed in the original design, or a line with a line width exceeding the line width specification. FIG. 3K illustrates a defect DF that erroneously bridging the adjacent line features and should have been removed during the fabrication step of FIG. 3H. The defect detection may be performed by inspecting the image generated by an imaging module (not separately shown) through the sensor 356. In some embodiments, the inspection tool 350 is an electron beam writer configured to inspect the photomask 300 and generate grayscale images, e.g., scanning electron microscope (SEM) image or backscattered electron (BSE) image, according to received electron intensity of the reflected electron beam.

Figure 3L:
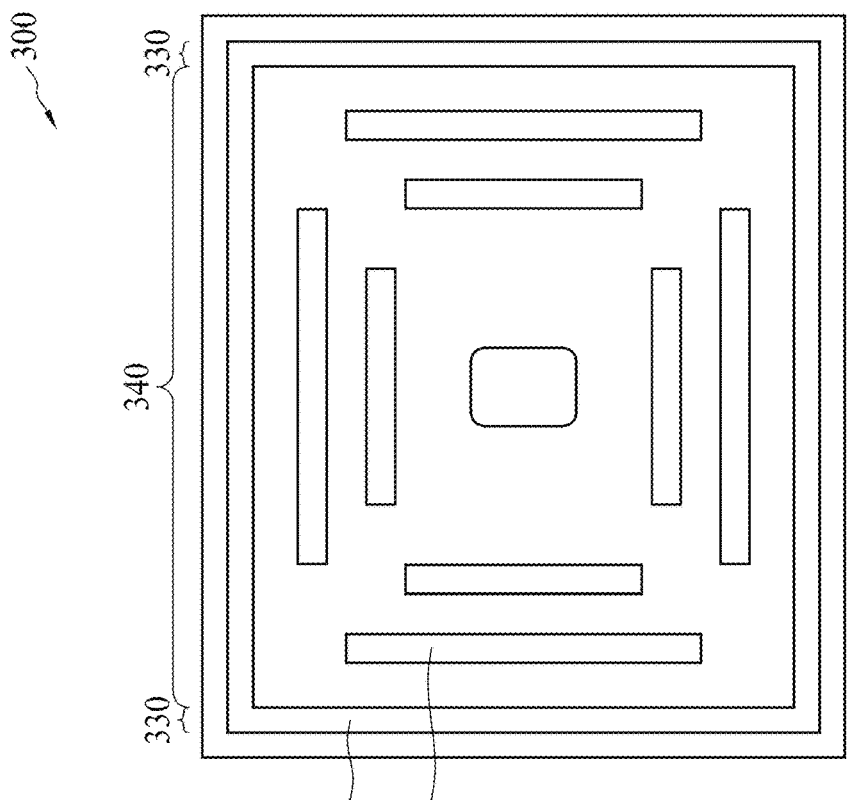
FIGS. 3K and 3L are top views of a photomask prior to and after a photomask repairing operation, respectively, in accordance with some embodiments of the present disclosure.
Figure 3K:
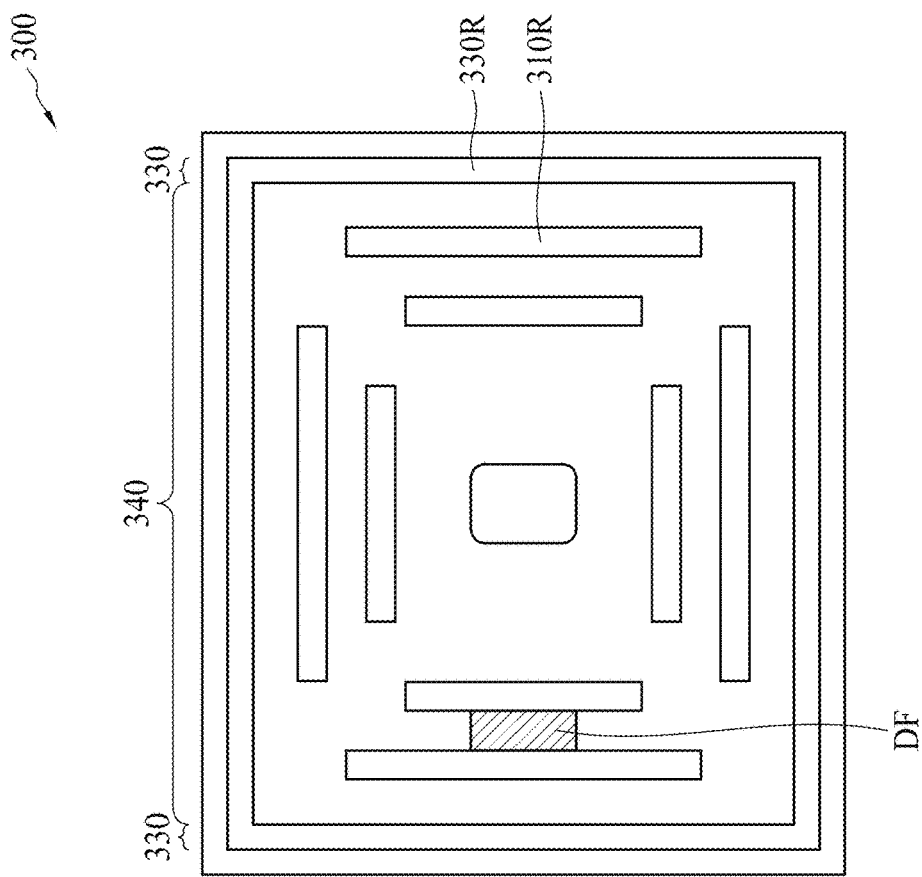

Referring to step 216 of FIG. 2 and FIG. 3J, if any defect is found, a mask repairing operation is performed. The mask repairing operation is performed to remove the unwanted material, e.g., the defect DF, in the photomask 300, e.g., by an etching operation. In some embodiments, an etching device 360 is used to perform the repairing by removing unwanted particles or trimming the circuit pattern on the ARC 310 or LAL 308 such that the dimensions of the circuit pattern in a lithography operation can meet the design requirements. In some embodiments, the etching device 360 is an electron source of an electron beam writer for performing electron beam etching. After the repairing operation, the circuit pattern on the ARC 310 of the photomask 300 may meet the design requirement. For example, the defect DF is removed such that the adjacent line features are successfully separated, as illustrated in FIG. 3L. In some embodiments, the inspection operation shown in FIG. 3I and the repairing operation shown in FIG. 3J are performed in-situ using the same electron beam writer system.

After the mask repairing operation is completed, the method 200 returns to step 212 to perform another photomask inspection. The loop will continue until no further defects are found in the photomask 300. At step 218, if it is determined that no mask defects are found, the fabrication, inspection and repairing operations of method 200 are completed.

In some embodiments, the inspection or repairing operations may be performed by the same tool. In the present embodiment, the inspection and repairing tool is an electron beam writer. The electron beam writer is capable of performing both the mask inspection and mask repairing, and switching between the inspection mode and the repairing mode. When the electron beam is used in photomask inspection, no etchant gas is introduced and the reflected electrons are used to illuminate the surface 300f of the photomask; while the etchant gas is employed during the repairing operation, material etching occurs by reaction of the etchant gas and the etched materials through help of the accelerated electrons. In some embodiments, the etchant gas includes a fluorine-based gas, such as $F_2$, $CF_4$, $SF_6$ and the like. In some embodiments, oxygen-based gas, such as $H_2O$, $O_2$, $O_3$ is introduced during the etching for facilitate the etching performance.

In embodiments where the repairing operation of the ARC 310 or LAL 308 is performed using an electron beam writer system, a defective area in the surface 300f is identified. A radiation source, e.g., the electron source 102 shown in FIG. 1, is configured to scan the defective area iteratively for removing the unwanted materials in the defective area. FIG. 4A is a schematic enlarged defective area 400D used in an electron beam repairing operation, in accordance with some embodiments of the present disclosure. Referring to FIG. 1 and FIG. 4A, during a repairing operation, the defective area 400D is partitioned into a grid of etching spots (ES), in which each etching spot ES is in a rectangular or square shape with a spot length or width W. The electrons emit out of the electron source 102 with predetermined beam energy, travel across the electron optical column 104 and focus on the surface 300f of the photomask 300. The electron beam 106 may have a majority of beam energy, e.g., 90%, 95% or 97% of the beam energy, within the area of the width W.

In some embodiments, the width W is in a range between about 0.1 nm and about 3 nm or between about 0.5 nm and about 2 nm, such as about 1.5 nm. The beam energy of the electron beam 106 is tunable by controlling an electron beam current and the bias voltage of the electron source 102. In some embodiments, the electron beam current is in a range between about 1 pA and about 100 pA. In some embodiments, the bias voltage is between about 0.1 kV and about 10 kV.

The defective area 400D is repaired by iteratively scanning each etching spot ES by the electron beam 106 in a predetermined scan order. When all of the etching spots ES have been scanned once, a scan loop is completed. A dwell time Td of illumination (etching) refers to the period of time during which the electron beam stays for illuminating an etching spot ES. The dwell time Td affects the effective electron beam energy applied to each ES. The total scanning time for executing a scan loop is determined by the number of etching spots ES and the dwell time Td of each ES. In some embodiments, the dwell time Td in each etching spot ES is between about 0.01 μs and about 5 μs.

When the defective area 400D is scanned during a scan loop, the scan order can be various according to various requirements. Referring to FIG. 4A, the defective area 400D is partitioned into a grid array formed of 12×8 etching spots. The numerals labelled in some of the etching spots ES denote the illumination order within a scan loop. A scan loop may start from a starting ES, e.g., ES-1, on the upper left corner of the defective area 400D. A scan loop is comprised of multiple scan cycles, in which a scan cycle refers to illuminating (etching) the etching spots ES within the same cycle in an island-hopping mode. For example, a first scan cycle includes the illumination of the ES-1, ES-2, ES-3, ES-4, ES-5 and ES-6 in order, in which the first scan cycle forms a zigzag scan route. In some embodiments, the scan cycle has a scan route extending in both the x-direction and the y-direction alternatively. A second scan cycle includes the illumination of the ES-7, ES-8, ES-9, ES-10, ES-11 and ES-12 in order, in which the second scan cycle forms a circular scan configuration. The scan loop may include more cycles for illumination of the remaining unilluminated etching spots ES until all of the etching spots ES are scanned once.

When a scan loop including multiple scan cycles are determined to repair the defective area 400D, a scan distance Ds of each pair of consecutive etching spots ES in a scan cycle, is determined. For example, as shown in FIG. 4A, a scan distance Ds of five etching spots ES is determined between any two consecutive etching spots ES in either the first or second scan cycle, regardless of the scan order or the scan route configuration. In some embodiments, the scan distance Ds can be represented in terms of actual dimensions instead of the number of the etching spots ES.

The scan distance Ds is tunable and determined by the factors, e.g., the material to be etched, the bias voltage, the electron beam energy and the etchant gas concentration. In some embodiments, on the one hand, a scan distance Ds greater than the optimal scan distance will reduce the etching performance on the two consecutive etching spots ES and the other etching spots ES therebetween; when the electron beams are successively applied to the adjacent etching spots ES with the scan distance Ds greater than the optimal scan distance, the energies of the two successive electron beams cannot be fully leveraged in a cooperative manner in etching the materials in the neighborhood of the two etching spots ES. On the other hand, a scan distance Ds less than the optimal scan distance will reduce the etching rate in the two etching steps due to insufficient reactant gas in the neighborhood. In some embodiments, the scan distance Ds may be kept unchanged during the entire repairing operation. In addition, a dwell time Td less than the optimal dwell time will cost more etching time. A dwell time Td greater than the optimal dwell time may cause undesirable defects, e.g., undercut, in the underlying layers. Therefore, the optimal values of the scan distance Ds and the dwell time Td affect the etching performance of the repairing operation and are correlated to each other given the determined bias voltage.

Figure 4B:
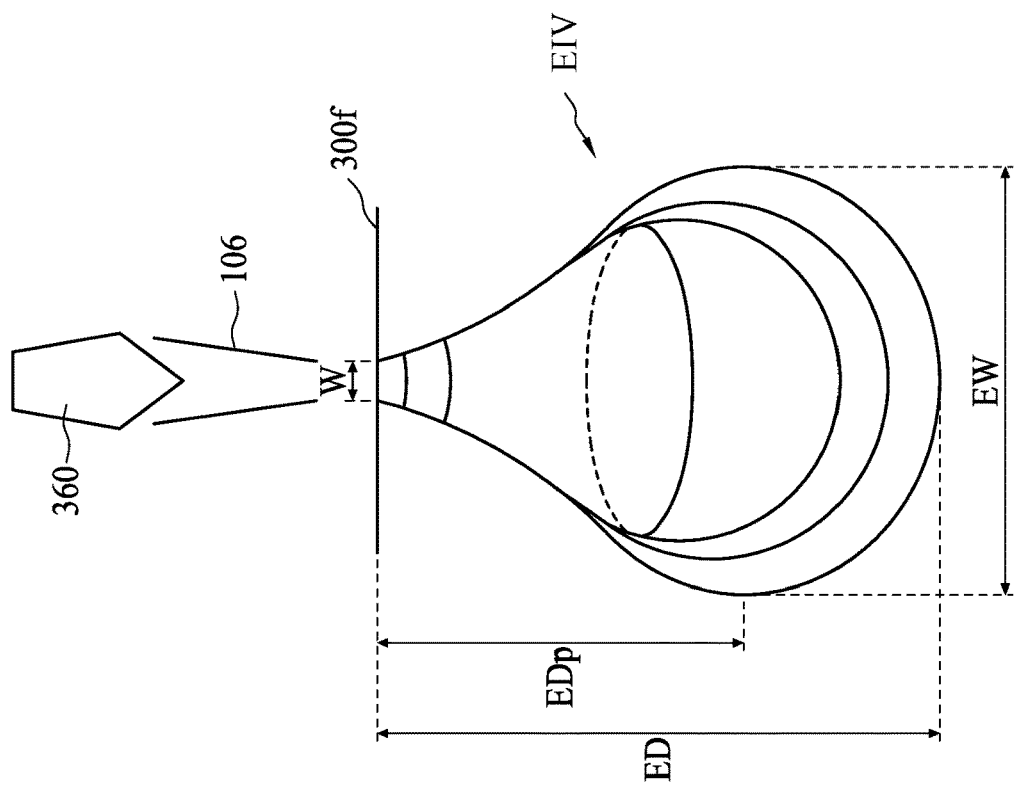
FIG. 4B is a plot showing an electron emission distribution, in accordance with some embodiments.
Figure 4A:
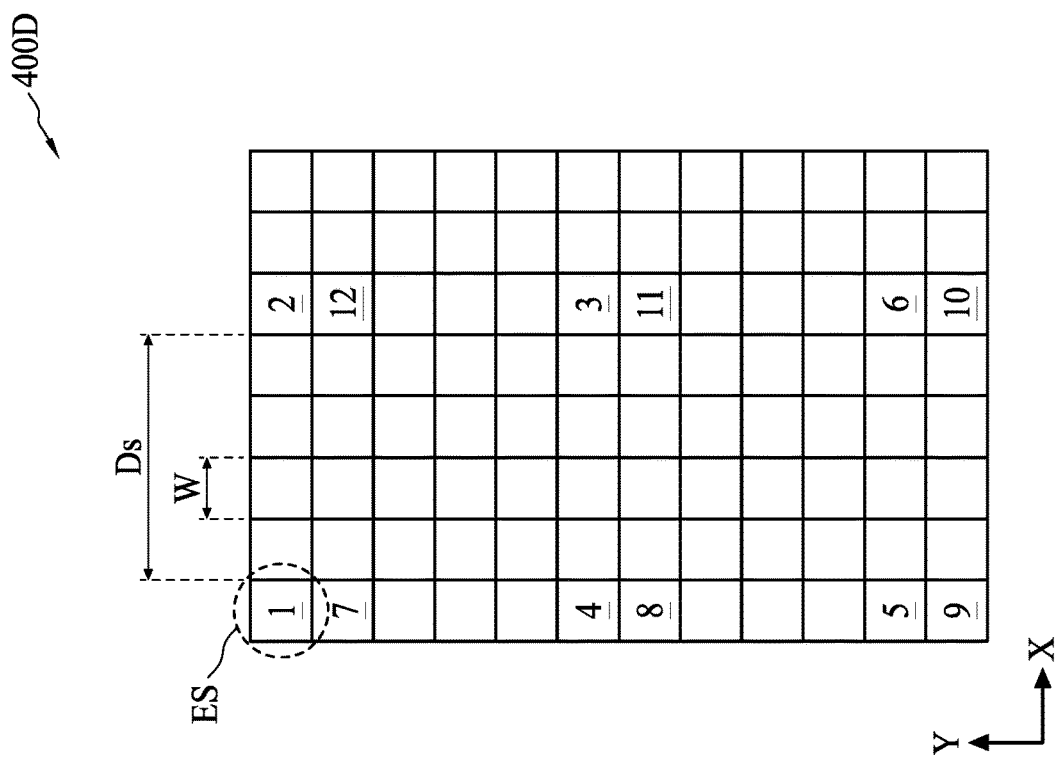
FIG. 4A is a schematic defective area in a repairing operation, in accordance with some embodiments of the present disclosure.

FIG. 4B is a plot showing an electron emission distribution, in accordance with some embodiments. As illustrated in FIG. 4B, the electron beam 106 emits from the electron source 360 and impinges on the surface 300f of the photomask 300. The impinging electrons interact with the materials of the photomask 300 and penetrate into a depth of the photomask 300, such as a depth in the ARC 310 or the LAL 308. The electrons react with the materials of the photomask 300 to form an electron interaction volume (EIV), in which the electron interaction may lead various products, e.g., secondary electrons, backscattered electrons, x-rays radiation, heating, and the like. In some embodiments, the electron interaction volume EIV is associated with an electron emission distribution represented by an emission width EW and an emission depth ED, in which the emission width EW and the emission depth ED represents the largest lateral dimension and vertical dimension, respectively, of the electron interaction volume EIV. In some embodiments, the electron interaction volume EIV has a peak energy level in a depth EDp where the emission width EW is measured. The emission width EW and the emission depth ED are determined by parameters including the bias voltage, the electron beam energy, the average atomic number (g/mole) of the materials interacting with the electrons, the density (g/cm$^3$) of the materials interacting with the electrons, and the like.

In some embodiments, before the etching operation starts, the electron beam is adjusted to focus on the photomask, and the reactant gas chemistry is managed at predetermined flow rates. The etching of the ARC 310 and the LAL 308 is triggered by the emitting accelerated electrons toward the ARC 310 and the LAL 308. The accelerated electrons are distributed both on the surfaces and on the inside of the ARC 310 and the LAL 308 in a distribution of an electron interaction volume EIV, as shown in FIG. 4B. The electrons with greater electron energy will attract more ionic etching gas and cause more etching to be conducted than those with less electron energy. In this connection, the etching efficiency of the repairing operation using the electron beam writer system is closely related to the emission depth ED or the depth EDp of the electron interaction volume EIV. Further, an electron interaction volume EIV with different emission widths EW will also affect the etching performance on the neighboring etching spots ES. Therefore, the etching performance of a scan cycle with an optimal scan distance Ds is closely related to the distribution of the electron interaction volume EIV.

In some embodiments, the configurations of the ARC 310 and the LAL 308 are quite different. For example, the thickness ratio between the ARC 310 and the LAL 308 is about 1:35 while an etching rate ratio between the ARC 310 and the LAL 308 is about 1:4.3 with respect to a same etchant gas and the bias voltage equal to or less than about 0.6 kV. Therefore, the etching times spent for the ARC 310 and the LAL 308 are in a ratio of about 1:7.8 with the bias voltage equal to or less than about 0.6 kV.

In some embodiments, the electron beam is configured with a bias voltage greater than about 0.6 kV, e.g., the bias voltage is in a rage between about 0.6 kV and about 10 kV, to move the majority of the accelerated electrons, e.g., the depth EDp of the electron interaction volume EIV. In this way, the high-energy electrons can propagate to the deeper portions of the LAL 308 during the etching of the ARC 310. The etching is likely to occur in the ARC 310 and the LAL 308 simultaneously prior to the complete removal of the ARC 310. In other words, by moving the majority of the accelerated electrons to the inside of the LAL 308, the etching time of the LAL 308 can be made shorter and closer to that of the ARC 310. Although the etching time of removing the ARC 310 alone may be prolonged, the enhanced etching time of the LAL 308 is still greater than the prolonged etching time of the ARC 310. Therefore, the overall etching time for removing the ARC 310 and the LAL 308 are still reduced.

In addition to the etching time, the electron beam writer system is operated according to a scan recipe to ensure the repairing operation can achieve better repairing performance. The performance indicators of the repairing operation may include, but not limited to, the etching time, surface uniformity of the exposed surface, etch durability of the exposed surface, etch reliability (reproducibility), and the like. In some embodiments, the etch durability of the exposed surface, e.g., the capping layer 306, refers to the sensitivity to the control of etching time (can be represented in terms of scan loops) and can be expressed as an etching time at which the capping layer 306 is damaged as compared to the etching time of removing the overlying LAL layer 308. In some embodiments, the etch durability is expressed as a ratio between the etching time to cause damage, e.g., a pit or recess, on the capping layer 306 and the etching time to remove the LAL layer 308, in which a greater etch durability ratio means greater etching control window.

Based on the above, the repairing performance is determined by the scan recipe of the electron beam writer system. In some embodiments, the scan recipe includes scan parameters, e.g., the beam energy (or equivalently the bias voltage) of the electron source, the electron current of the electron beam, the number of scan loops, the number of scan cycles in each scan loop, the scan route configurations of each scan cycle, the scan distance Ds of a scan cycle, the dwell time Td, the material and flow rate of the etchant gas, and the like.

The repairing performance is further determined by the configurations of the photomask 300. For example, the ARC 310 and the LAL 308 have different thicknesses in the photomask 300. Further, the ARC 310 and the LAL 308 have different etching rates. Therefore, the abovementioned scan recipe should be tuned by taking consideration of the configurations of photomask 300, e.g., the ARC 310 and the LAL 308.

As discussed previously, the proposed bias voltage is greater than about 1 kV. The scan recipe is tuned based on the proposed bias voltage. For example, the scan distance Ds is set as about 3 etching spots ES, wherein the spot width W of the etching spot ES is about 1.5 nm, and the dwell time Td is set at about 0.05 µs. A zigzag scan cycle route is selected. The electron beam current is set as 10 pA. The flow rate of the etching gas is set at about 2 sccm for $CF_4$ and about 0.2 sccm for $O_2$. Through the management of the scan recipe based on the setting of the bias voltage equal to or greater than about 1 kV to move the majority of the electrons to the inside of the LAL 308, the etching times spent for the ARC 310 and the LAL 308 are in a ratio of about 1:1.7, which indicates a significant reduction of the etching time of the LAL 308, as compared to the etching time ratio of about 1:7.8 under the bias voltage set as about 0.6 kV. The overall etching time is thus decreased.

In conducting the repairing operation using the bias voltage at less than or equal to about 0.6 kV, the electron beam may bombard the surface of the capping layer 306 at a relatively mild energy in order not to damage the capping layer 306 during the etching of the LAL 308. However, as discussed previously, a less bias voltage results in a smaller electron emission depth ED, leading to a longer etching time of the LAL 308. In addition, the more concentrated accelerated electrons in each illumination of the etching spot ES may not be advantageous when the beam energy runs through the capping layer 306. As a result, a longer etching time along with more concentrated electrons may cause inferior etch durability of the capping layer 306 under the bias voltage configuration of about 0.6 kV.

In the present disclosure, the scan recipe is revisited, in which the bias voltage is raised from below about 0.6 kV to be higher than about 0.6 kV to increase the emission depth ED of the electron interaction volume EIV. This arrangement will cause the capping layer 306 to be exposed to the high-energy electrons with a shortened period. Further, the density of the electron interaction volume EIV is reduced due to the expanded volume, and thus the damage to the capping layer 306 is decreased. As a result, the etch durability of the capping layer 306 under a bias voltage greater than about 0.6 kV can be enhanced if the scan recipe is determined accordingly. In some embodiments, the bias voltage is equal to or greater than about 1 kV. In some embodiments, the bias voltage is in a range between about 1 kV and bout 3 kV.

Figure 5:
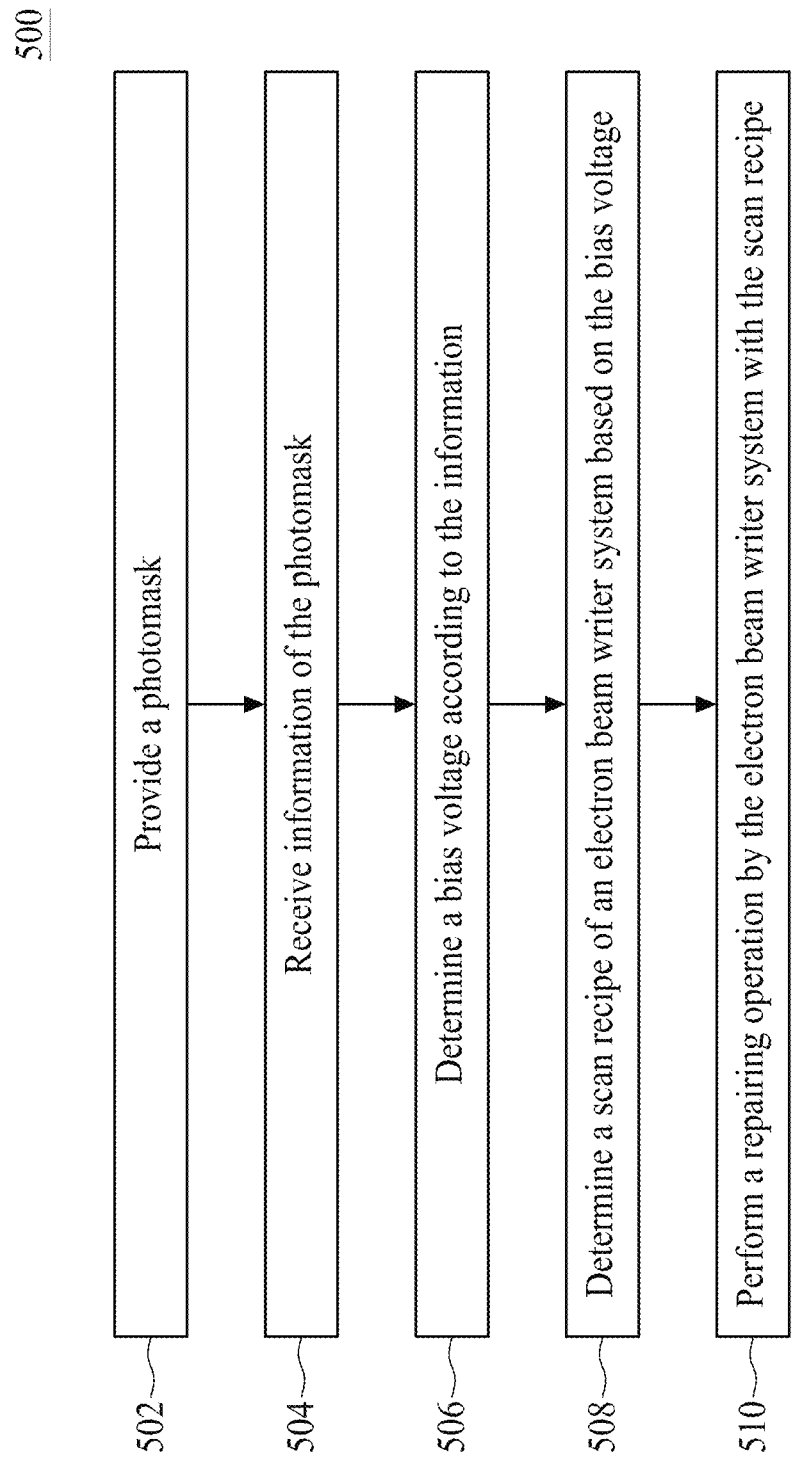
FIG. 5 is a flowchart of a method of repairing a photomask, in accordance with some embodiments of the present disclosure.

FIG. 5 is a flowchart of a method 500 of repairing a photomask, in accordance with some embodiments. It should be understood that additional operations can be provided before, during, and after the various steps shown in FIG. 5, and some of the operations described below can be replaced or eliminated, for additional embodiments of the method 500.

At step 502, a photomask is provided or received. The photomask may be similar to the photomask 300 shown in FIGS. 3A to 3J. In some embodiments, the photomask includes a multilayer stack, a capping layer, an LAL and an ARC disposed over one another.

At step 504, information of the photomask is received. In some embodiments, information on at least one of the thickness of the ARC and the thickness of the LAL are received. In some embodiments, information on a thickness ratio between the ARC and the LAL is received. In some embodiments, the received information of the ARC and the LAL further includes one or more of the materials, etching rates, and a ratio of etching rates between the ARC and the LAL.

At step 506, a bias voltage of an electron beam writer system is determined according to the information. In some embodiments, the bias voltage is set in a range higher than about 1 kV, in which the LAL and ARC are formed of TaBN and TaBO, respectively, and a thickness ratio between the LAL and the ARC is equal to or higher than about 10, equal to or higher than about 30 or equal to or higher than about 35. In some embodiments, the bias voltage is set in a range higher than or substantially equal to about 3 kV, in which the ARC and LAL being formed of TaBN and TaBO, respectively, and a thickness ratio between the LAL and the ARC is equal to or higher than about 10, equal to or higher than about 30 or equal to or higher than about 35.

In some embodiments, a thickness summation T1 of the LAL and the ARC is received. A bias voltage is determined which is associated with an electron interaction volume EIV having an electron emission depth ED1, such that a depth ratio K1 between the electron emission depth ED1 and the thickness summation T1 is substantially equal to or greater than about 0.1. In some embodiments, the depth ratio K1 is substantially equal to or greater than about 0.3. In some embodiments, the depth ratio K1 is substantially equal to or greater than about 0.5. In some embodiments, the bias voltage is determined such that a depth EDp, at which the emission width EW of the electron interaction volume EIV is measured or at which a peak value of the distribution of the electron interaction volume EIV is measured, is within the range of the LAL.

At step 508, a scan recipe of the electron beam writer system is determined based on the determined bias voltage. In some embodiments, the bias voltage or the beam energy is included in the scan recipe. The scan recipe may further include at least one of the parameters such as the number of scan loops, the scan distance Ds between consecutive etching spots (ES), the dwell time Td of ES, the electron current of the electron beam, the configurations (e.g., materials, proportions or flow rates) of the etchant gas, and the like. In some embodiments, the bias voltage, or equivalently the beam energy, of the electron beam is included in the scan recipe.

In some embodiments, steps 506 and 508 are iterated to determine the optimal bias voltage and the optimal values of the scan recipe. The successively obtained bias voltage and the scan recipe values may be obtained by an algorithm to reach the respective converged values. In some embodiments, a predetermined number of iterations are provided to determine the optimal bias voltage and the optimal scan recipe values.

At step 510, a repairing operation is performed by the electron beam writer system with the scan recipe. In some embodiments, the repairing operation etches at least one of the ARC and the LAL to expose the capping layer. In some embodiments, an inspection operation is performed after the repairing operation to ensure the defective area has been repaired successfully. In some embodiments, step 510 is performed by conducting iterative inspection-repairing cycles and is explained in greater detail with reference to in FIG. 6.

Figure 6:
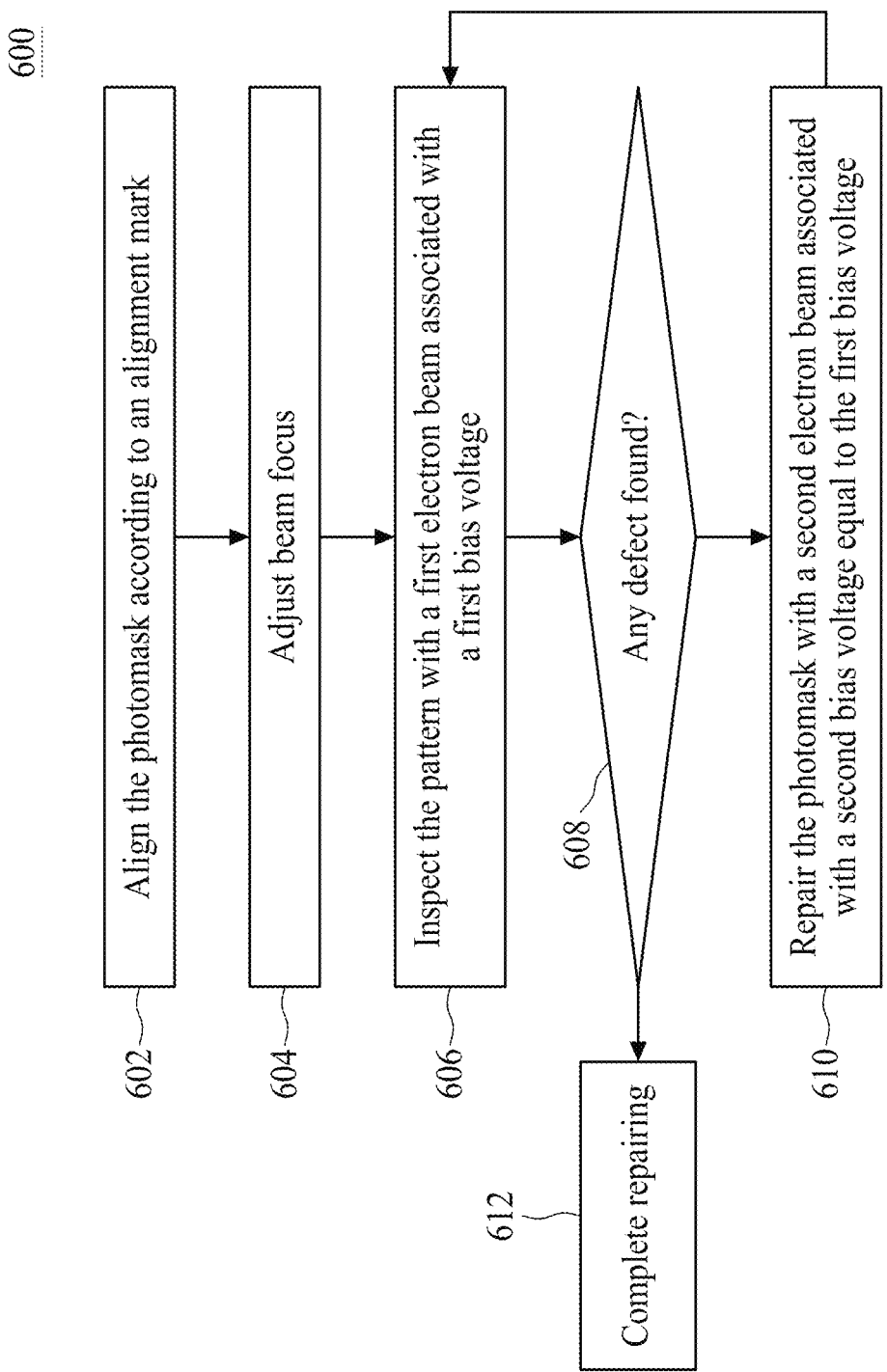
FIG. 6 is a flowchart of a method of repairing a photomask, in accordance with some embodiments of the present disclosure.

FIG. 6 is a flowchart of a method 600 of repairing a photomask, in accordance with some embodiments. It should be understood that additional operations can be provided before, during, and after the various steps shown in FIG. 6, and some of the operations described below can be replaced or eliminated, for additional embodiments of the method 600. The method 600 can be implemented in place of or in addition to the steps 212, 214 and 216 in FIG. 2 or step 510 in FIG. 5.

At step 602, the photomask is aligned according to an alignment mark. In some embodiments, the photomask is arranged on a stage of a fabrication tool, e.g., an electron beam writer system. The photomask includes one or more alignment marks formed thereon. The one or more alignment marks are used to align with the fabrication tool before the repairing operation. The alignment mark may be in a strip shape, a cross shape or other suitable shape.

At step 604, the beam focus of the electron beam writer is adjusted to focus on the photomask. In some embodiments, the beam focus is adjusted using the alignment marks as an adjusting target to ensure that the electron beam has a projection with a circular shape on the photomask.

At step 606, an inspection operation is performed on the photomask to check whether any defect exists on the photomask. The photomask is inspected by applying a first electron beam associated with a first bias voltage. The first bias voltage may be associated with a first scan recipe, in which the parameters of the first scan recipe are similar to those previously discussed. Since the first scan recipe is used in an inspection mode, the optimal values of the first scan recipe may be different to that in a repairing operation except the bias voltage. For example, no etchant gas is used and only one scan loop is required. The scan distance Ds may be reduced to zero. In some embodiments, the first scan recipe at least includes the first bias voltage or the beam energy associated with the first bias voltage. During the inspection mode, the first electron beam are emitted from the electron beam writer and impinge on various materials of the photomask from above and the transmitted or reflected electrons are collected to generate an image.

In some embodiments, the first bias voltage is determined according to steps 504 and 506 of FIG. 5. In some embodiments, the first bias voltage is set in a range greater than about 1 kV, e.g., between about 1 kV and about 10 kV. In some embodiments, the first bias voltage is set at about 3 kV.

In some embodiments, the inspection operation generates an aerial image of the photomask according to different methods. In some embodiments, the SEM image is generated by collecting secondary electrons reflected from the photomask. In alternative embodiments, the BSE image is generated by collecting backscattered electrons.

At step 608, it is determined that whether any defect is found in the inspection image. In some embodiments, the inspection image is a grayscale image, in which the brightness of the inspection image is positively related to the quantity of electrons collected, and thus a higher bias voltage of the electron beam leads to a higher gray level. By help of the proposed scheme of operating the electron beam writer with a higher bias voltage, the sensitivity of the etching end-point detection is enhanced.

At step 610, if it is determined that at least one defect is found in the photomask, in which the defect type belongs to an unwanted material or foreign particle, the photomask is repaired by removing the defect using an etching operation by applying a second electron beam associated with a second bias voltage, wherein the second bias voltage may be associated with a second scan recipe. In some embodiments, the second bias voltage used in the photomask repairing operation is substantially equal to the first bias voltage of the first scan recipe used in the photomask inspection operation. In some embodiments, the step 606 of adjusting the beam focus for the first bias voltage is completed prior to applying the first electron beam associated with the first bias voltage for the inspection operation, and method 600 is free from any further adjustment of the beam focus prior to applying the second electron beam to perform the repairing operation.

In some embodiments, once the photomask repairing operation is completed, the method 600 loops back to step 606 to perform another photomask inspection operation. The inspection operation is to ensure that the photomask repairing operation is successful and the dimensions of the circuit pattern on the photomask are within the specification. In some embodiments, the specification is less than 10% of the line width of the circuit pattern. The iterations of steps 606, 608 and 612 will continues until all of the defects are found and repaired.

At step 612, if it is determined that no defects are found in the photomask, the photomask repairing operation is completed.

Figure 7A:
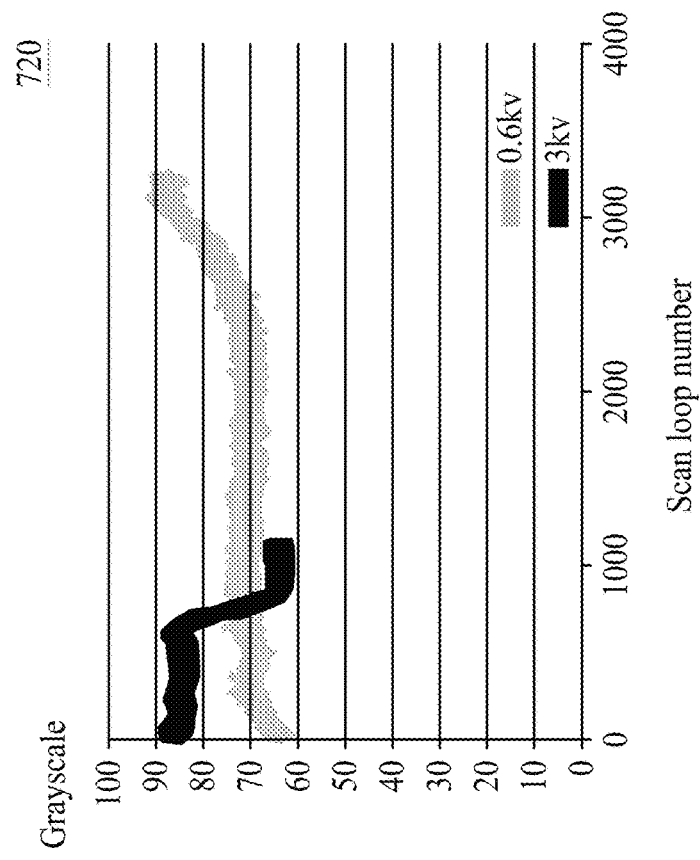
FIGS. 7A and 7B are plots showing detection of an etching end-point using different inspection images, in accordance with some embodiments of the present disclosure.
Figure 7B:
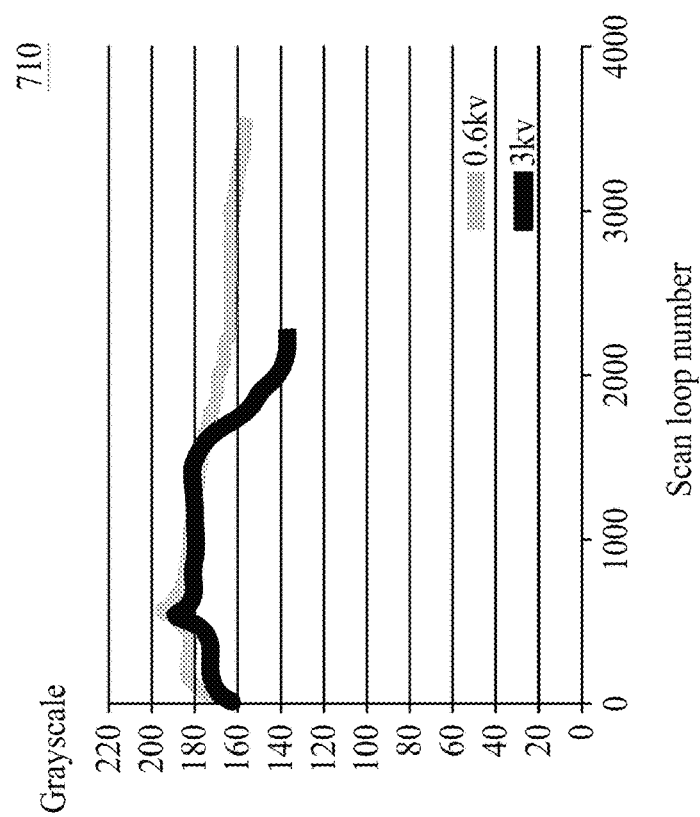

FIGS. 7A and 7B are plots 710 and 720 showing the detection of the etching end-point using different inspection images, in accordance with some embodiments of the present disclosure. The horizontal axis represents the etching time in terms of the number of scan loops, and the vertical axis represents the grayscale level of the image captured from the defective area. A greater grayscale value means a brighter shade in the image due to greater electron energy. The grayscale levels for different bias voltage configurations are illustrated, in which the bias voltages are less than 1 kV (e.g., 0.6 kV) and greater than about 1 kV (e.g., about 3 kV), respectively.

As discussed previously, an inspection image can be generated through collection of the electrons reflected from the photomask. The inspection image can include different grayscale levels according to different types of images. Referring to FIG. 7A, an SEM image is generated for assisting the etching end-point detection, in which the grayscale level is largely associated with the characteristics of the exposed surface of the photomask. Since the received intensity of the electron energy in the proposed scheme is greater due to higher bias voltage and greater electron kinetic energy, it can be observed that the difference of grayscale levels between different materials are more pronounced in the proposed scheme, e.g., about 50 grayscale levels. In contrast, the scenario of using about 0.6 kV can provide only about 40 grayscale levels in contrasting different materials.

Referring to FIG. 7B, a BSE image is generated for assisting the etching end-point detection, in which the gray level is largely associated with the characteristics of the material below the exposed surface of the photomask. Specifically, as discussed previously, the grayscale level of the BSE image is determined by the average atomic number of the materials that reflect the electrons. As shown in FIG. 7B, since the exiting method adopts a less bias voltage, the BSE image reflects the material characteristics mainly in the LAL and the capping layer. Since the capping layer is formed of Ru or $RuO_2$ having an average atomic number greater than that of the LAL, which is generally formed of TaBN, the intensity of the BSE image will increase when the etching is close to the surface of the capping layer.

In contrast, in the proposed scheme when the etching is close to the surface of the capping layer, the backscattered electrons are received from the deeper layer, e.g., the multilayer stack. Since the topmost layers of the multilayer stack is formed of Si layers having an average atomic number less than that of the LAL, the intensity of the BSE image or the grayscale levels of the image will decrease when the etching is close to the surface of the capping layer. The change of the grayscale levels in the proposed scheme, in a range between about 30 grayscale levels and about 40 grayscale levels, is greater than that of the method using the bias voltage at about 0.6 kV. As a result, the detection sensitivity of the etching end-point is improved using the proposed bias voltage.

In some embodiments, the proposed photomask repairing and inspection scheme is also applicable to a transmission type photomask. For example, a binary photomask, a super binary photomask, or an opaque-MoSi-on-glass photomask. In some embodiments, the transmission type photomask includes a transparent substrate, which is generally made of quartz, configured to allow the radiation beam to pass through. A light-shielding layer and an anti-reflection coating are deposited over the substrate, in which a circuit pattern is formed on the light-shielding layer and the anti-reflection layer. In some embodiments, the etching rate of the anti-reflection coating is less than the etching rate of the light-shielding layer and the thickness of the anti-reflection coating is less than the thickness of the light-shielding layer. The proposed inspection and repairing scheme is useful in applying a bias voltage associated with an electron interaction volume EIV to cause a portion of accelerate electrons to reach the light-shielding layer. The etching of the light-shielding layer and the anti-reflection coating can be conducted simultaneously prior to the complete removal of the anti-reflection coating, thereby reducing the overall etching time of the light-shield layer and the anti-reflective coating.

Figure 8:
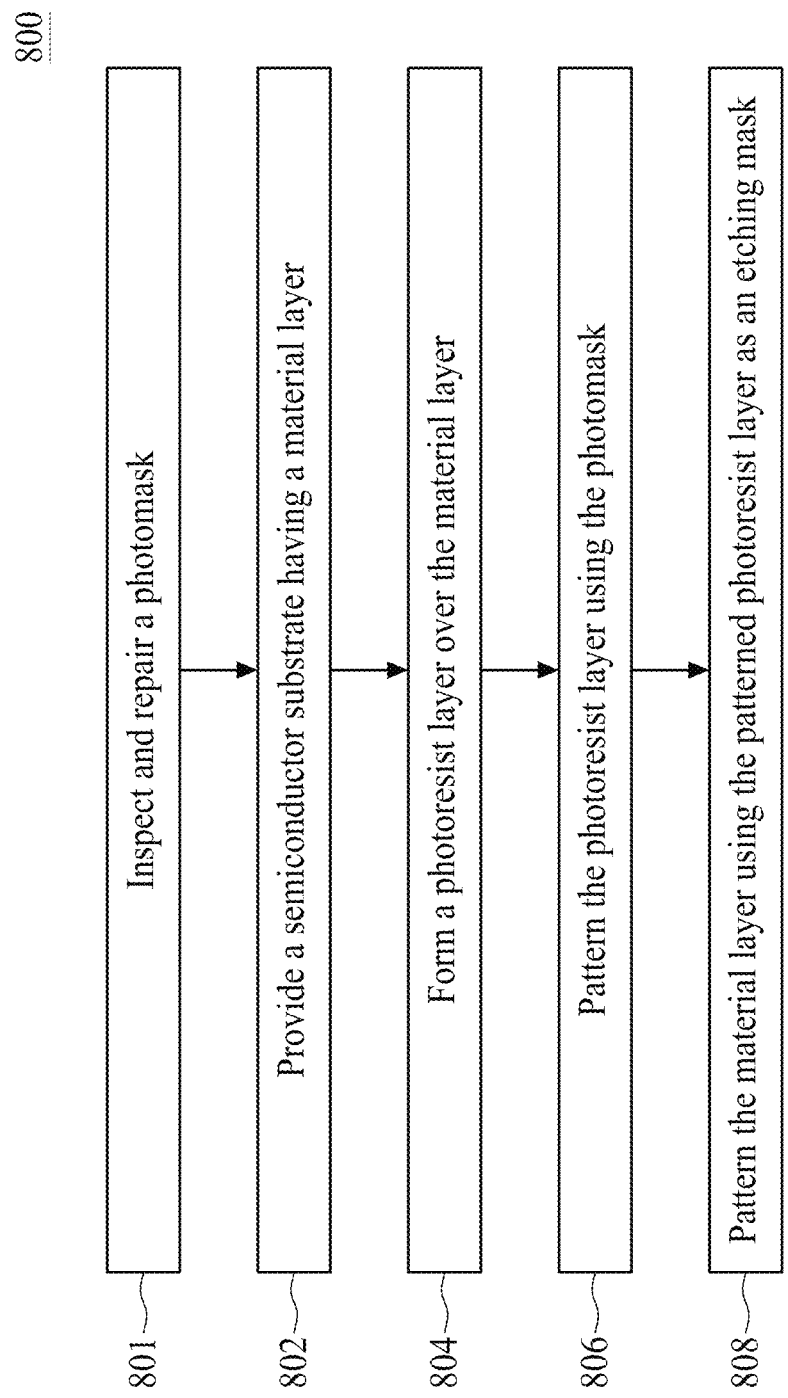
FIG. 8 is a flowchart of a method of manufacturing a semiconductor device, in accordance with some embodiments of the present disclosure.

FIG. 8 is a flowchart of a method 800 of manufacturing a semiconductor device, in accordance with some embodiments. It should be understood that additional operations can be provided before, during, and after the various steps shown in FIG. 8, and some of the operations described below can be replaced or eliminated, for additional embodiments of the method 800.

The semiconductor device may be manufactured using an EUV photomask, such as the photomasks 300 described in relation to FIGS. 3A to 3J. The method 800 begins at step 801, wherein a photomask is provided. The photomask may be an EUV photomask, such as the photomask 300. The photomask is inspected and repaired using the inspection/repairing operations described in relation to FIGS. 3A to 3J.

At step 802, a semiconductor substrate having a material layer is provided. The semiconductor substrate includes a semiconductor material such as silicon. In some embodiments, the semiconductor substrate may include other semiconductor materials, such as silicon germanium, silicon carbide, gallium arsenide, or the like. In some embodiments, the semiconductor substrate is a p-type semiconductive substrate (acceptor type) or n-type semiconductive substrate (donor type). Alternatively, the semiconductor substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate is a semiconductor-on-insulator (SOI) substrate. In other alternatives, the semiconductor substrate may include a doped epitaxial layer, a gradient semiconductor layer, and/or a semiconductor layer overlaying another semiconductor layer of a different type, such as a silicon layer on a silicon germanium layer.

In some embodiments, the material layer may be a semiconductor layer, a dielectric layer or a conductive layer. In some embodiments, the material layer may be embedded in the semiconductor substrate or deposited over the semiconductor substrate. The material layer may be formed of a single layer or may include a multilayer structure.

At step 804, a photoresist layer is formed over the material layer. The photoresist layer may be formed over the material layer by CVD, PVD, ALD, spin coating, or other suitable film-forming method. Next, the method 800 continues with step 806, in which the photoresist layer is patterned using a photomask, such as the photomask 300 as described above, in a lithography operation. In an embodiment, the photomask 300 may be disposed on a photomask stage of a lithography system and the semiconductor substrate is disposed on a wafer stage. The lithography operation may involve projection of a patterned exposure radiation onto the photoresist layer through transmission or reflection of the photomask 300. Portions of the photoresist layer may be removed after the lithography operation.

The method 800 continues with step 808 to pattern the material layer using the patterned photoresist layer as an etching mask. Next, the photoresist layer is removed. The removal operations may include an etching or ashing operation. In some embodiments, the method 800 loops back to step 801 to perform another inspection/repairing operation on the photomask prior to performing another lithography operation using the photomask.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

According to an embodiment, a method includes; providing a photomask, wherein the photomask includes a multilayer stack arranged over a substrate, the multilayer stack configured to reflect a radiation beam; a capping layer arranged over the multilayer stack; a light-absorption layer arranged over the capping layer; and an anti-reflection coating arranged over the light-absorption layer. The method further includes: receiving information on the photomask; determining a bias voltage according to the bias voltage; determining a scan recipe of an electron beam writer system based on the information; and performing a repairing operation on at least one of the anti-reflection coating or the light-absorption layer by the electron beam writer system with the scan recipe.

According to an embodiment, a method includes proving a photomask that includes a multilayer stack arranged over a substrate, the multilayer stack configured to reflect a radiation beam; a capping layer arranged over the multilayer stack; a light-absorption layer arranged over the capping layer; and an anti-reflection coating arranged over the light-absorption layer. The photomask includes a pattern formed on the anti-reflection coating and the light-absorption layer. The method further includes; inspecting the pattern by applying a first electron beam using a predetermined scan recipe; and performing a repairing operation by applying a second electron beam according to the predetermined scan recipe in response to a defect as being found in the photomask.

According to an embodiment, a method includes providing a photomask comprising an anti-reflection coating and a light-absorption layer over a substrate, wherein a circuit pattern is formed in the anti-reflection coating and the light-absorption layer. The method further includes: receiving information on the photomask, the information at least includes thicknesses of the anti-reflection coating and the light-absorption layer; determining a first bias voltage of an electron beam writer system according to the information; inspecting the circuit pattern by applying a first electron beam with the first bias voltage to the photomask; and repairing the photomask by applying a second electron beam with the first bias voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing a photomask comprising:
a multilayer stack arranged over a substrate, the multilayer stack configured to reflect a radiation beam;
a capping layer arranged over the multilayer stack;
a light-absorption layer arranged over the capping layer; and
an anti-reflection coating arranged over the light-absorption layer;
receiving information on the photomask;
determining a bias voltage according to the information;
determining a scan recipe of an electron beam writer system based on the bias voltage; and
performing a repairing operation on at least one of the anti-reflection coating or the light-absorption layer by the electron beam writer system with the scan recipe.

2. The method according to claim 1, further comprising:
inspecting the photomask to determine if a defect is found in the photomask; and
manufacturing a semiconductor device using the photomask if no defect is found.

3. The method according to claim 1, wherein the radiation beam has a wavelength of about 13.5 nm.

4. The method according to claim 1, wherein the information comprises a first thickness of the anti-reflection coating, a second thickness of the light-absorption layer, a first etching rate of the anti-reflection coating and a second etching rate of the light-absorption layer.

5. The method according to claim 4, wherein determining a bias voltage according to the information comprises determining the bias voltage according to a thickness ratio between the second thickness to the first thickness.

6. The method according to claim 1, wherein the information comprises an electron emission depth of an electron interaction volume, wherein the bias voltage is determined further according to the electron emission depth.

7. The method according to claim 1, wherein the performing of the repairing operation generates an electron interaction volume associated with the bias voltage, wherein a peak value of a distribution of the electron interaction volume is within the light-absorption layer.

8. The method according to claim 1, wherein the bias voltage is in a range between about 1 kV and about 10 kV.

9. The method according to claim 1, wherein the anti-reflection coating is formed of TaBO and the light-absorption layer is formed of TaBN.

10. The method according to claim 1, wherein the repairing operation is performed by scanning a plurality of etching spots on the photomask with a number of scan loops, wherein a scan loop includes a number of scan cycles, wherein the scan recipe comprises at least one of the number of scan loops, a scan distance of each scan cycle, a scan route configuration of each scan cycle, a dwell time of each etching spot, or a flow rate of an etchant gas.

11. A method, comprising:
proving a photomask comprising:
 a multilayer stack arranged over a substrate, the multilayer stack configured to reflect a radiation beam;
 a capping layer arranged over the multilayer stack;
 a light-absorption layer arranged over the capping layer; and
 an anti-reflection coating arranged over the light-absorption layer, wherein the photomask includes a pattern formed on the anti-reflection coating and the light-absorption layer;
inspecting the pattern with a first electron beam associated with a first bias voltage; and
performing a repairing operation by applying a second electron beam associated with a second bias voltage substantially equal to the first bias voltage in response to a defect as being found in the photomask.

12. The method according to claim 11, wherein the second electron beam is configured to cause etching on the anti-reflection coating and the light-absorption layer simultaneously prior to removal of the anti-reflection coating.

13. The method according to claim 11, wherein the first and second bias voltages are about 3 kV.

14. The method according to claim 11, wherein performing a repairing operation by applying a second electron beam comprises determining a scan recipe of the second electron beam according to the first bias voltage.

15. The method according to claim 11, further comprising generating an inspection image, wherein the inspecting comprises detecting an etching end-point according to the inspection image based on electrons associated with the first bias voltage.

16. The method according to claim 15, wherein the first bias voltage is determined such that the detecting an etching end-point detects a decrease of a grayscale level of the inspection image when an etching of the repairing operation is close to a surface of the capping layer.

17. The method according to claim 16, wherein the inspection image is a backscattered electron image.

18. The method according to claim 11, wherein the second electron beam has an electron emission depth, and the anti-reflection coating and the light-absorption layer have a thickness sum, wherein a ratio between the electron emission depth and the thickness sum is greater than about 0.1.

19. A method, comprising:
providing a photomask comprising an anti-reflection coating and a light-absorption layer over a substrate, wherein a circuit pattern is formed in the anti-reflection coating and the light-absorption layer;
receiving information on the photomask, the information at least comprising thicknesses of the anti-reflection coating and the light-absorption layer;
determining a first bias voltage of an electron beam writer system according to the information;
inspecting the circuit pattern by applying a first electron beam associated with the first bias voltage to the photomask; and
repairing the photomask by applying a second electron beam associated with the first bias voltage.

20. The method according to claim 19, further comprising adjusting a beam focus of the first electron beam prior to applying the first electron beam associated with the first bias voltage, wherein the method is free from further adjustment of the beam focus prior to applying the second electron beam.

* * * * *